United States Patent [19]

Alvin et al.

[11] Patent Number: 4,620,156
[45] Date of Patent: Oct. 28, 1986

[54] CONDITION INDICATOR

[75] Inventors: Kjell Alvin; Kurt Hakansson, both of Ludvika, Sweden

[73] Assignee: Asea Aktiebolag, Västerås, Sweden

[21] Appl. No.: 663,369

[22] Filed: Oct. 22, 1984

[30] Foreign Application Priority Data

Oct. 24, 1983 [SE] Sweden .............................. 8305842

[51] Int. Cl.$^4$ ............................................ G01R 31/02
[52] U.S. Cl. ..................................... 324/424; 340/638
[58] Field of Search ............... 324/424; 340/638, 644, 340/652, 664; 361/94, 96, 97; 364/482, 484, 492

[56] References Cited

U.S. PATENT DOCUMENTS

| | | | |
|---|---|---|---|
| 3,505,644 | 4/1970 | Morris | 340/644 |
| 4,101,826 | 7/1978 | Horitsman | 340/664 |
| 4,412,267 | 10/1983 | Hansen | 361/94 |
| 4,532,499 | 7/1985 | Collin | 340/644 |

FOREIGN PATENT DOCUMENTS 2727378  1/1979  Fed. Rep. of Germany .

Primary Examiner—Reinhard J. Eisenzopf
Assistant Examiner—G. Peterkin
Attorney, Agent, or Firm—Watson, Cole, Grindle & Watson

[57] ABSTRACT

A device for monitoring the condition of a high voltage circuit-breaker comprises as current-sensing members a number of reed contacts, which are located in such a way in relation to the current path through the circuit-breaker that the contacts are activated at different current levels. The reed elements control a pulse train to a counter, which takes place with different dignity for the different elements. With the aid of a position transducer connected to the contact device of the circuit-breaker, the pulse train is started simultaneously with the opening of the circuit-breaker, the contents of the counter thus being a measure of the contact wear. The contact position transducer is also used for measuring the opening speed, and if said speed falls below a certain value, alarm is triggered.

4 Claims, 7 Drawing Figures

CONDITION INDICATOR

BACKGROUND OF THE INVENTION

1. Field of the Invention

The present invention relates to a means for monitoring the condition of electric devices with current-breaking contacts, in particular high voltage cirucit-breakers.

2. Prior Art

Most high voltage circuit-breakers are dismantled for maintenance unnecessarily often. The reason for this is simple to understand: It is better to intervene once to many than running the risk of a circuit-breaker losing its function, thus causing damage to the whole switchgear. The problem so far has been to correctly determine when it is time for service. For example, for circuit-breakers in normal distribution networks with few interruptions each year, it is the operating device of the circuit-breaker and the condition of said device that need to be checked ("exercised", lubricated), whereas the breaking poles in principle never have to be touched. For circuit-breakers in very heavy operation in industry the situation may be the reverse.

A device for monitoring the condition of circuit-breakers, proposed in the patent publication DE-OS No. 27 27 378, includes a current transformer as current sensing member. Such a transformer involves relatively high costs and, in addition, for reasons of space, is difficult to locate in modern compact switchgear cubicles.

It is further known, from U.S. Pat. No. 4,101,826, to use reed contacts for indicating fault currents. In that connection, however, the reed contact is used only for setting a flip-flop which in turn starts a pulse transducer, whereby a timing circuit resets the flip-flop after a definite number of pulses. No registration of current quantity, arcing energy or other measurement values for determining the contact wear takes place in this device.

SUMMARY OF THE INVENTION

The object of the present invention is to provide a relatively simple and reliable condition indicator, which requires little space and which continuously monitors the circuit-breaker and triggers a signal when maintenance is needed. This is achieved according to the invention by using as current-sensing members a plurality of reed contacts adapted to become activated at different current levels. The reed contacts are arranged to control a train of pulses to a counter, whereby the pulses are added according to a "weighted" system, where the different reed contacts have different dignity. The contents of the counter are thus a measure of the contact wear.

The statistics show that the predominant part of all circuit-breaker faults originate from mechanical factors. With an improved design of the condition indicator according to the present invention, also a great number of these faults can be discovered and corrected in time. This embodiment is characterized in that a position transducer, connected to the movable parts of the circuit-breaker and arranged to start the above-mentioned pulse train, is also used for measuring the contact speed of the circuit-breaker, whereby alarm is triggered if the speed falls below a certain value.

BRIEF DESCRIPTION OF THE DRAWING

The invention will be described in greater detail with reference to an embodiment shown in the accompanying drawing, wherein.

DESCRIPTION OF THE PREFERRED EMBODIMENT

Figure 1:
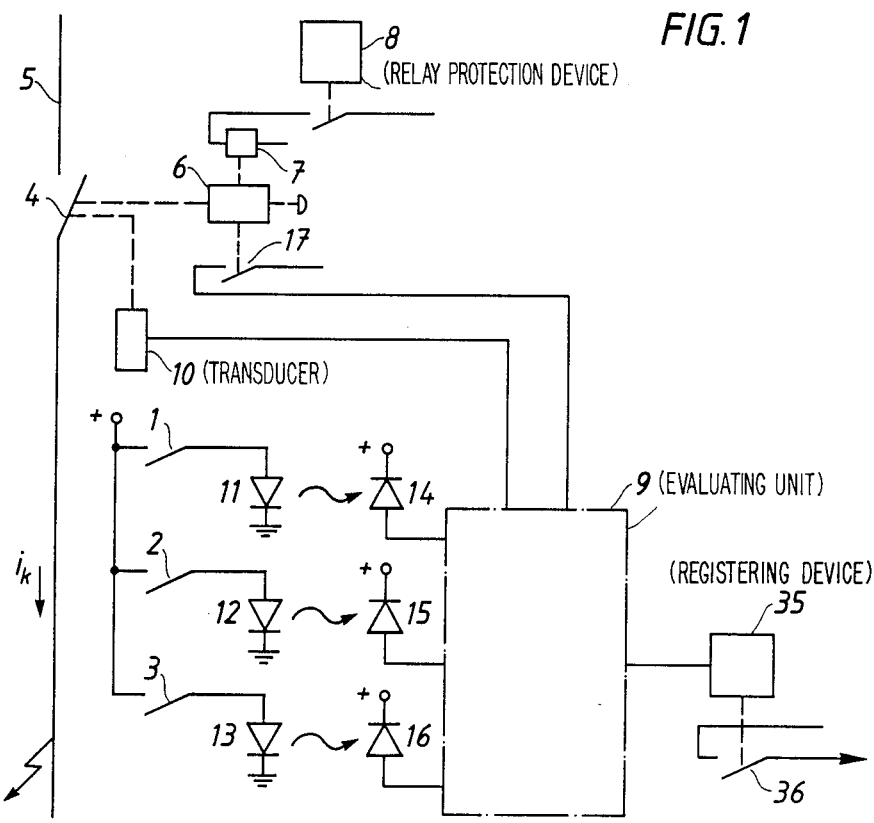
FIG. 1 shows an principal diagram of part of the condition indicator according to the invention.
Figure 2:
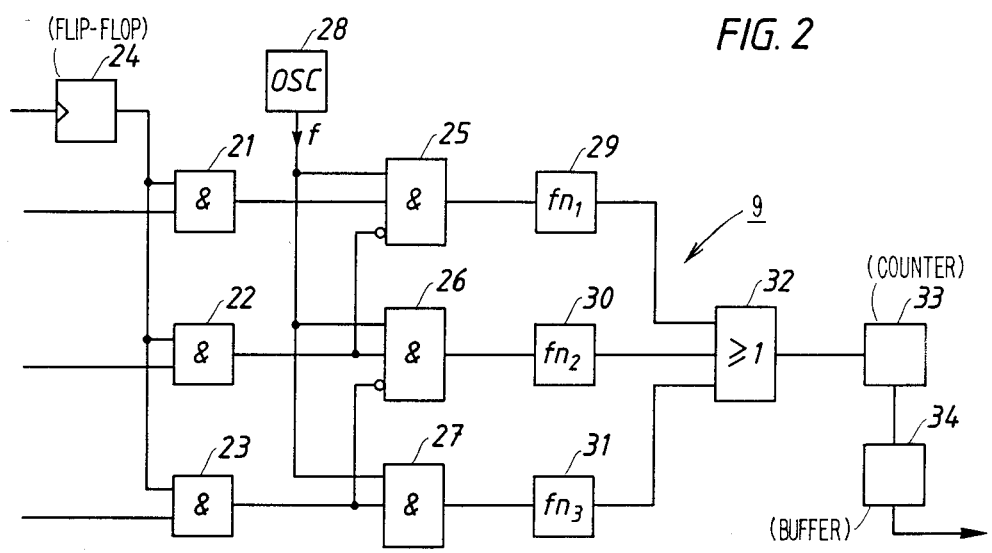
FIG. 2 shows schematically an example of the embodiment of the evaluating unit of the indicator for the contact wear.

The means shown in FIG. 1 is intended to monitor the condition of one breaking pole in a high voltage circuit-breaker, the current-breaking contact 4 of which is connected into a main circuit 5. The circuit-breaker has an opening device 6 with a tripping magnet 7, which is controlled from a relay protection device 8.

The device comprises an evaluating unit 9 for estimating the wear, to which there is connected a current-sensing member located near the main current path 5. This member consists of three reed contacts 1, 2, 3 which are arranged in such a way as to become activated at different current levels. The reed contacts are connected to the evaluating unit 9 via optoelectronic members, which may consist of optic switches or of separate light-emitting diodes 11, 12, 13 which are connected, via light conductors, to detectors 14, 15, 16, for example in the form of photodiodes.

The evaluating unit 9, which may suitably be provided with an internal battery for the current supply, is activated upon opening of the circuit-breaker by way of a microswitch 17 arranged adjacent to the tripping magnet 7. Starting of the measurement takes place upon an impulse from a position transducer 10, connected to the main contact 4 of the circuit-breaker, when said contact opens.

The pulse trains from the reed contacts 1, 2 and 3 are supplied to one input each of an and-element 21, 22 and 23, respectively, arranged in the evaluating unit 9. The start signal received from the position transducer 10 is supplied to the other input of said and-elements via a monostable flip-flop 24 with a differentiating input. The outputs from the and-elements 21, 22, 23 are connected to one input each of a second and-element 25, 26, 27, the other input of which is supplied with pulses with a high frequency from an oscillator 28. The frequency f of the pulses is considerably higher than the operating frequency of the network 5. The outputs from the and-elements 22, 23 are, in addition, connected to a negated input of each of the and-elements 25, 26. The pulse trains from the and-elements 25, 26, 27 further pass via frequency multipliers 29, 30, 31 for weighting of the current levels of the reed elements. The outputs of the frequency multipiliers are connected via an or-element 32 to an electronic counter 33 with a buffer member 34 for read-out to a mechanical registering device 35 with an alarm contact 36.

Figure 3:
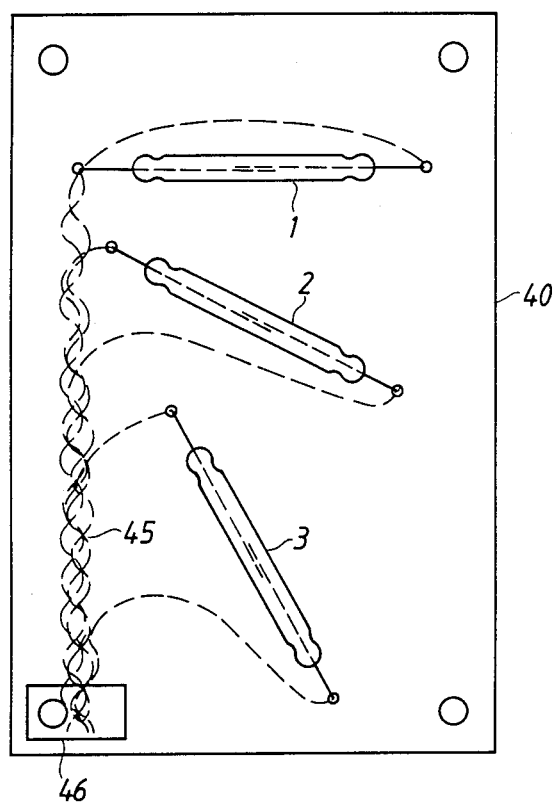
FIGS. 3 and 4 show in plane view and side view, respectively, the current-sensing members of the indicator.
Figure 4:
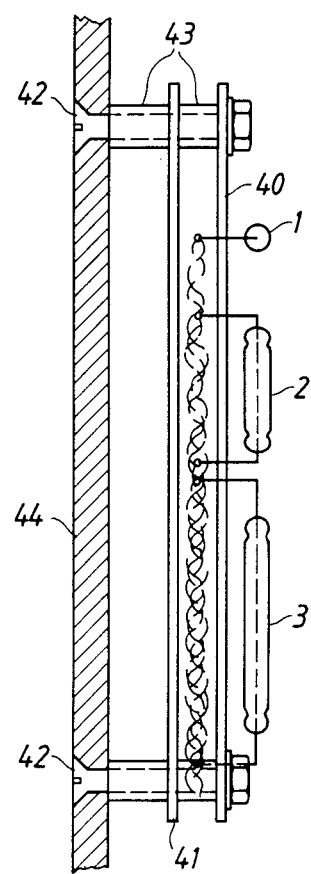
Figure 5:
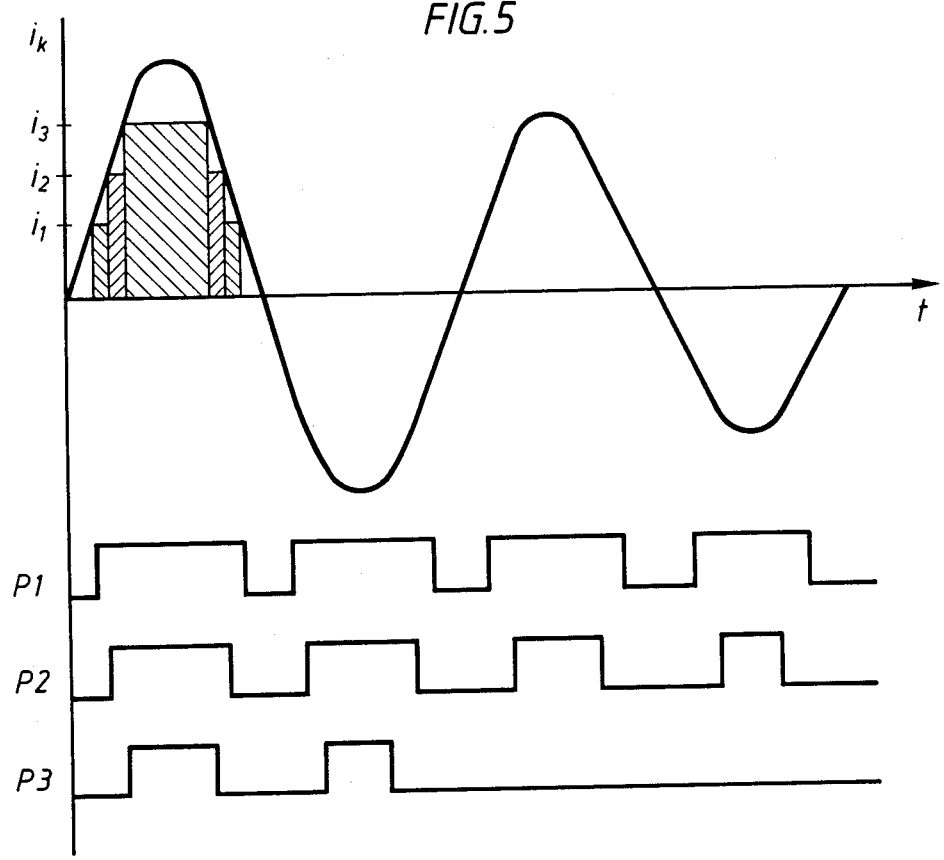
FIG. 5 shows a current curve for part of a short-circuit as well as the associated pulse train generated by the reed contacts of the indicator.

FIGS. 3 and 4 show how the current-sensing member of the indicator may be arranged in principle. The three reed contacts 1, 2, 3 are here mounted on an insulating plate 40 which, together with a second insulating plate 41 located behind it, may be fixed by means of screws 42 and spacers 43 directly on a current busbar 44 or on a construction part fixed in relation to the current busbar. The reed contact 1 is disposed with its longitudinal axis lying substantially in the direction of the magnetic field lines, whereas contacts 2 and 3 are inclined at different angles relative to the field lines. In that way, the contact making of the reed contacts takes place at different current levels. The connection leads 45 to the reed contacts are positioned between the plates 40, 41 and are fixed in a clamp 46. For operation in practice, the current-sensing member is suitably formed with a casing cast in plastic. FIG. 5 shows the short-circuit current $i_k$ in the conductor 5 plotted against time t as well as the pulse trains P1, P2, P3 which are thus generated by the reed contacts 1, 2, 3. The current values at which the contact making of the respective reed contacts takes place are designated $i_1$, $i_2$ and $i_3$. In view of the life of the reed contact, the closing value $i_1$ of reed contact 1, which is the lowest of the three values, should lie somewhat higher than the rated current of the circuit-breaker. For calculating the contact wear upon the interruptions which take place at lower currents and the numbers of which can be registered with the aid of the position transducer 10, in order to be on the safe side it may be presupposed that all these interruptions take place at the rated current.

Figure 6:
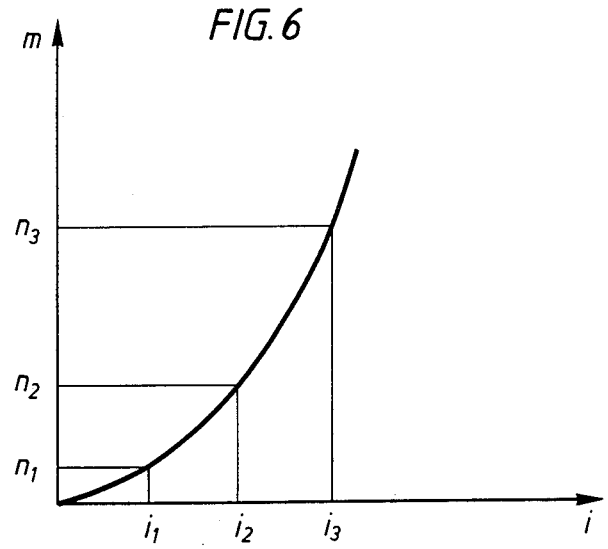
FIG. 6 shows an explanatory curve of the contact wear plotted against the current for determining the weighting numbers of the pulses.

For determining the weighting numbers $n_1$, $n_2$, $n_3$ for the pulses from the three reed contacts, an empirically determined curve of the contact wear m as a function of the current i can be the starting-point. Such a curve may, for example, have the appearance shown in FIG. 6. By inserting in this diagram the closing values $i_1$, $i_2$, $i_3$ for the three reed contacts, the relationship between the weighting numbers can be determined, which numbers in a certain equipment may be, for example, $n_1 = 1$, $n_2 = 5$ and $n_3 = 100$.

Figure 7:
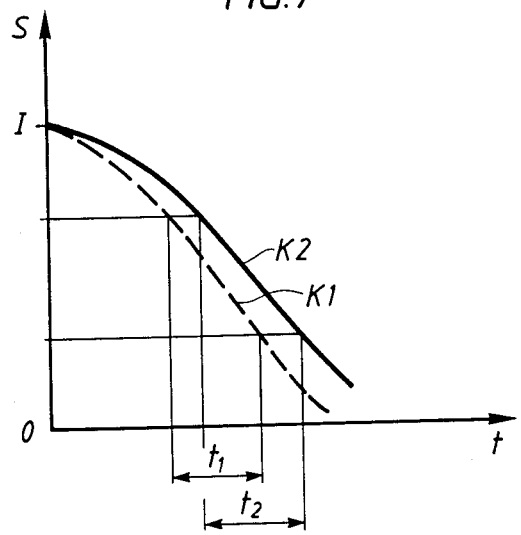
FIG. 7 shows a measured contact movement curve for a circuit-breaker as well as a comparable reference curve.

The contact position transducer may, for example, consist of a fixedly mounted so-called reading fork, comprising a light-emitting diode (LED) and a phototransisitor arranged spaced from said LED and in the direction of the light ray, as well as a circular disc mounted on the input operating shaft in the mechanism housing of the circuit-breaker and having one or more projecting sectors. The disc is adapted such that, when operating the circuit-breaker, it alternately cuts off and lets through the LED light. With this transducer, it is possible to measure the time for a certain rotating angle of the operating shaft of the circuit-breaker, thus obtaining information about the current contact speed. After signal processing in the evaluating unit 9, the output signal from the transducer is compared with a reference in a microcomputer unit, and in case of a deviation above a certain level an alarm signal is given. This is illustrated in FIG. 7 in which curve K2 represents the contact movement upon opening plotted against the time for a certain circuit-breaker, whereas curve K1 is a reference curve. In this figure the closed position of the circuit-breaker is designated I and the open position is designated 0. The time for a certain sector passage of the program disc in the position indicator is $t_2$ in the current case, which is to be compared with the shorter time $t_1$ of the reference circuit-breaker. If the opening speed falls below a certain value, this may be a sign that the operating device need lubricating or "exercising" (if the circuit-breaker has not been operated for a very long time) or that a mechanical fault has occured.

The invention is not limited to the embodiment shown in the drawing but several modifications are feasible within the scope of the claims.

We claim:

1. Means for monitoring the condition of an electric device with current-breaking contacts defining movable parts, in particular a high voltage circuit-breaker, said means comprising members (1, 2, 3) for sensing the current through the circuit-breaker, a calculating member (9) which is controlled from an activating member (10) influenced by the movable parts of the device and which is connected to said current-sensing members and arranged to calculate a value—corresponding to the sensed current—of the contact wear during a breaking operation, and a presentation member (35) which is controlled from the calculating member (9) and arranged to record the degree of the total contact wear, said current-sensing members (1, 2, 3) comprising a plurality of reed contacts having different sensitivity and/or being arranged in different positions relative to the current path (5) through the device, so that the reed contacts (1, 2, 3) are activated at different current levels, said calculating member (9) including means for weighting the pulses generated by the different reed contacts (1, 2, 3).

2. Means according to claim 1, wherein the reed contacts (1, 2, 3) are connected to the calculating member (9) by way of optic switches or light conductors.

3. Means according to claim 1, wherein said activating member (10) consists of a reading fork which is influenced by a cam disc connected to the movable parts of the device.

4. Means according to claim 1, wherein the activating member (10) is arranged to measure the contact speed of the circuit-breaker, the means comprising members for triggering an alarm if the speed is lower than a certain value.

* * * * *